(12) United States Patent
Schuette

(10) Patent No.: US 8,488,377 B2
(45) Date of Patent: Jul. 16, 2013

(54) MASS STORAGE DEVICE WITH SOLID-STATE MEMORY COMPONENTS CAPABLE OF INCREASED ENDURANCE

(75) Inventor: Franz Michael Schuette, Colorado Springs, CO (US)

(73) Assignee: OCZ Technology Group Inc., San Jose, CA (US)

( * ) Notice: Subject to any disclaimer, the term of this patent is extended or adjusted under 35 U.S.C. 154(b) by 0 days.

(21) Appl. No.: 12/943,192

(22) Filed: Nov. 10, 2010

(65) Prior Publication Data

US 2011/0110158 A1 May 12, 2011

Related U.S. Application Data

(60) Provisional application No. 61/260,045, filed on Nov. 11, 2009.

(51) Int. Cl.
*G11C 11/40* (2006.01)

(52) U.S. Cl.
USPC .................. 365/185.01; 365/185.17; 257/528

(58) Field of Classification Search
USPC ........................ 365/185.01, 185.17; 257/528
See application file for complete search history.

(56) References Cited

U.S. PATENT DOCUMENTS

| | | | | |
|---|---|---|---|---|
| 5,663,901 | A * | 9/1997 | Wallace et al. | 365/52 |
| 7,352,601 | B1 * | 4/2008 | Minneman et al. | 365/51 |
| 2005/0094439 | A1 * | 5/2005 | Tao | 365/185.05 |
| 2005/0243609 | A1 * | 11/2005 | Yang et al. | 365/189.05 |
| 2010/0025811 | A1 * | 2/2010 | Bronner et al. | 257/528 |
| 2011/0286280 | A1 * | 11/2011 | Kellam et al. | 365/185.19 |
| 2011/0299317 | A1 * | 12/2011 | Shaeffer et al. | 365/106 |

* cited by examiner

*Primary Examiner* — Hoai V Ho
*Assistant Examiner* — Jay Radke
(74) *Attorney, Agent, or Firm* — Hartman Global IP Law; Gary M. Hartman; Domenica N. S. Hartman

(57) ABSTRACT

A mass storage device that utilizes one or more solid-state memory components to store data for a host system, and a method for increasing the write endurance of the memory components. The memory components are periodically heated above an intrinsic operating temperature thereof to a preselected temperature that is sufficient to thermally recondition the memory component in a manner that increases the write endurance of the memory component.

11 Claims, 2 Drawing Sheets

MASS STORAGE DEVICE WITH SOLID-STATE MEMORY COMPONENTS CAPABLE OF INCREASED ENDURANCE

CROSS REFERENCE TO RELATED APPLICATIONS

This application claims the benefit of U.S. Provisional Application No. 61/260,045, filed Nov. 11, 2009, the contents of which are incorporated herein by reference.

BACKGROUND OF THE INVENTION

The present invention generally relates to mass storage devices for use with computers and other processing apparatuses. More particularly, this invention relates to a high speed non-volatile (permanent memory-based) mass storage device that utilizes flash memory components and on-board means for performing thermal treatments capable of increasing the endurance of the memory components.

Mass storage devices such as advanced technology (ATA) or small computer system interface (SCSI) drives are rapidly adopting non-volatile memory technology, such as flash memory components (chips) or another emerging solid-state memory technology, including phase change memory (PCM), resistive random access memory (RRAM), magnetoresistive random access memory (MRAM), ferromagnetic random access memory (FRAM), organic memories, or nanotechnology-based storage media such as carbon nanofiber/nanotube-based substrates. Currently the most common solid-state technology uses NAND flash memory components as inexpensive storage memory, often in a form commonly referred to as a solid-state drive (SSD).

NAND flash memory has several limitations that are inherent to the design and function of the technology. Briefly, flash memory components store information in an array of floating-gate transistors, referred to as cells. The cell of a NAND flash memory component has a top gate (TG) and a floating gate (FG), the latter being sandwiched between the top gate and the channel of the cell. The floating gate is separated from the channel by a layer of tunnel oxide. Data are stored in a NAND flash cell in the form of a charge on the floating gate which, in turn, defines the channel properties of the NAND flash cell by either augmenting or opposing the charge of the top gate. The process of programming a NAND cell requires injection of electrons into the floating gate by quantum mechanical tunneling. Programming and erasing of NAND flash cells is an extremely harsh process utilizing electrical fields in excess of 10 million V/cm to move electrons through the tunnel oxide layer.

The brute force approach used to program and erase NAND flash results in wear and fatigue of the cells by causing atomic bond sites in the tunnel oxide layer to break. The broken-bond sites then become a trap for electrons that mimic charges in the floating gate, which can cause false data to be read from the NAND flash cells or prevent correct erasing of the cells. In the case of single level cells, where only one bit is stored per cell, the trapping of electrons is a relatively minor issue that gradually increases to a critical threshold over tens of thousands of program and erase cycles. However, in the case of multilevel cells that use, for example, four different levels to encode two bits per cell, the "drift" in charge caused by a steady build-up of electrons in the tunnel oxide layer and at the borders between the layers constitutes the predominant limitation of write endurance. In 55 nm process technology, typical write endurance is on the order of about 10,000 program/erase cycles per cell, but with smaller process technologies, this number dramatically declines. For example, for a 3× nm process, typical write endurance is on the order of about 3000 to 5000 cycles per cell, and for a 22 nm process write endurance estimates decrease toward about 900 to about 1200 program/erase cycles per cell.

The build-up of charge in the oxide layer and its boundaries also depends on the time allowed between program/erase cycles of cells. That is, over time the tunnel oxide layer releases trapped electrons. This process is referred to as detrapping of electrons, and is sometimes also described as self-healing of the tunnel oxide. It is also known in the art that, above about 75° C., possible reconditioning may occur with the tunnel oxide layer that may skew the results of write endurance tests performed on NAND flash-based SSD. In particular, a detrimental side effect of heat is reduced data retention, in that heat also increases leakage current from the floating gate, thereby altering the charge and, by extension, the program state of a NAND flash cell.

Hierarchical storage management (HSM) is a data storage technique that moves data between relatively high-cost "first tier" storage media and other less expensive but slower storage media. Traditionally, HSM systems have utilized high-speed storage devices such as rotational media-based hard disk drives (HDD) as the first tier of storage media, and optical discs, magnetic tape drives and/or other less expensive but slower storage media as higher tiers of the HSM system. Recently, this landscape has changed in that the cost of HDDs has decreased considerably and, simultaneously, SSDs have gained substantial market share. Compared to hard disk drives, flash-based SSDs are extremely fast, especially with respect to access times since no rotational or seek latencies are incurred at initial data accesses. Consequently, SSDs have become a viable candidate for the first tier storage media in HSM systems. However, in this particular role data are constantly rewritten, causing excessive wear because of very high erase/program cycle frequencies.

In view of the above, it would be desirable to speed up self-healing and thereby increase the write endurance of solid-state memory components of a mass storage device, for example, a solid-state drive used as a first tier storage media in a HSM system.

BRIEF DESCRIPTION OF THE INVENTION

The present invention provides a mass storage device that utilizes one or more solid-state memory components to store data for a host system, and a method for increasing the write endurance of the memory components.

According to a first aspect of the invention, the mass storage device includes a printed circuit board, at least one solid-state memory component on the printed circuit board, a system interface connector on the printed circuit board and adapted to connect the mass storage device to the host system, a memory controller on the printed circuit board and adapted to communicate between the host system and the memory component, means on the printed circuit board for heating the memory component to a preselected temperature that is above an intrinsic operating temperature of the memory component and sufficient to thermally recondition the memory component and thereby increase the write endurance of the memory component, and means for controlling the heating means to heat the memory component to the preselected temperature.

According to a second aspect of the invention, a method is provided for increasing the write endurance of at least one solid-state memory component of a mass storage device connected to a host system for storing data thereof. The method includes heating the memory component above an intrinsic operating temperature of the memory component and to a preselected temperature that is sufficient to thermally recondition the memory component and thereby increase the write endurance of the memory component. The method further includes inhibiting convection and radiation heat transfer losses from the memory component to the host system.

A technical effect of the invention is the ability to increase the write endurance of a solid-state memory component, for example, a NAND flash memory component, by utilizing the intentional application of heat to the component. In the case of a NAND flash memory component, thermal reconditioning resulting from the application of heat involves self-healing of a tunnel oxide layer and/or floating gate of the component. The memory component can be periodically heated to the preselected temperature at predefined intervals, or the temperature of the memory component can be cycled between the preselected temperature and a lower temperature that can also be elevated above the other otherwise intrinsic operating temperature of the memory component, such that the memory component is intentionally continuously heated during the operation of the mass storage device.

Other aspects and advantages of the invention will be better appreciated from the following detailed description.

DETAILED DESCRIPTION OF THE INVENTION

Mass storage devices of interest to the invention are nonvolatile memory-based mass storage devices, referred to herein as solid-state drives (SSDs) as a result their use of solid-state memory components (chips), a particular example of which is a NAND flash memory component that allows data to be stored, retrieved and erased on a block-by-block basis, with each block (or sector) being a predetermined section of the component. Each time a memory block of a flash memory component on an SSD undergoes a program/erase cycle, the integrity and functionality of the block degrades, referred to as wear, as a result of charge build-up in the tunnel oxide layer of the component. Eventually, a block of the memory component will fail to completely erase, that is, fail to reset all cells to 1, or will exceed a critical time threshold for program/erase operations, at which point the block will need to be retired.

Figures 1, 2:
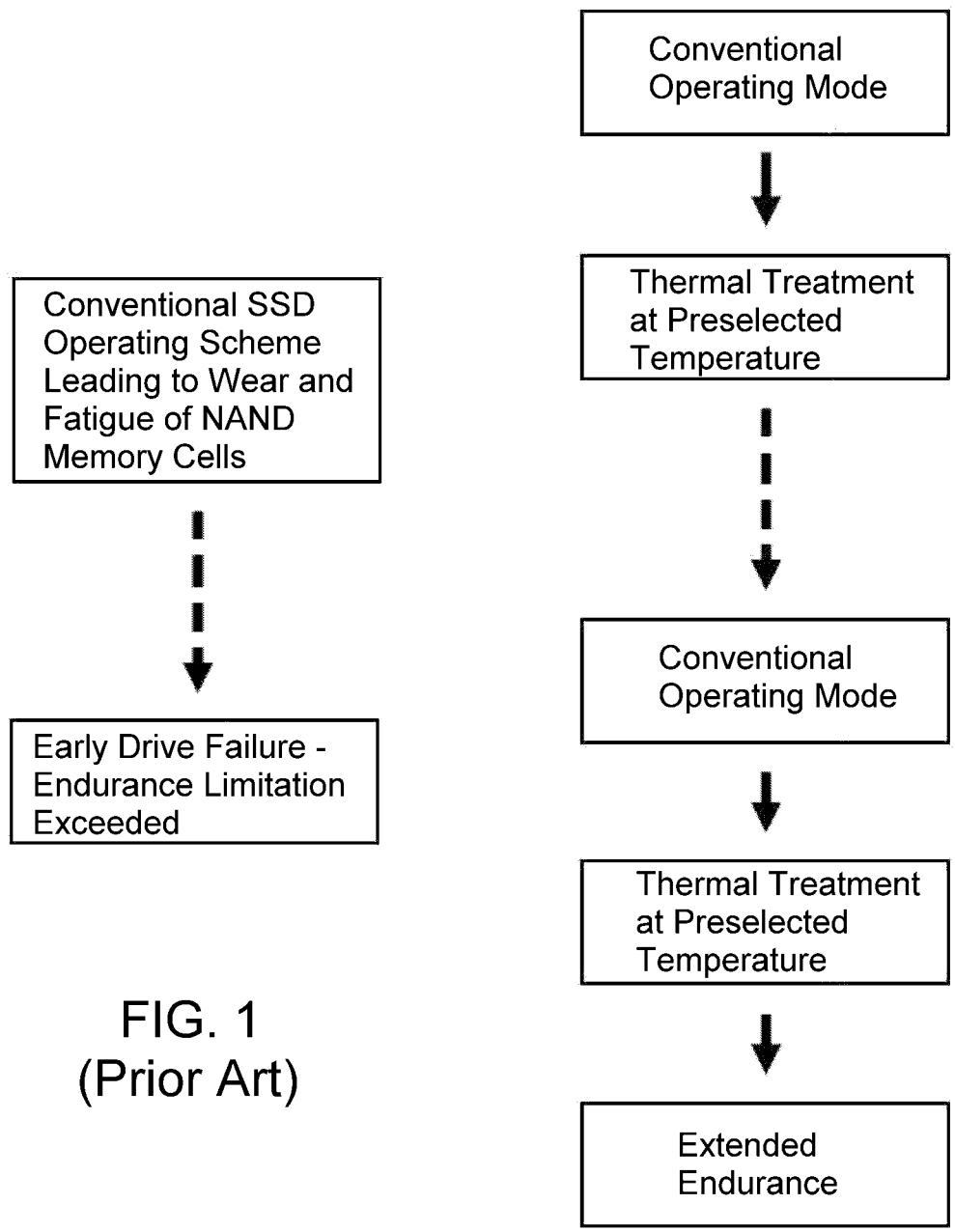
FIG. 1 represents a conventional operating scheme of a solid-state drive in a high-traffic, high-access computer memory system environment, leading to wear and early fatigue and failure of the drive because the write endurance of NAND flash solid-state memory components of the drive is exceeded.
FIG. 2 represents an operating scheme of a solid-state drive according to an embodiment of the invention, wherein NAND flash solid-state memory components of the drive are subjected to a thermal treatment at intervals inserted into the operating scheme to increase the write endurance of the memory components.

FIG. 1 represents a conventional operating scheme for an SSD, and indicates that the operating scheme of the SSD leads to early failure of the SSD due to wear and fatigue of its NAND flash memory components eventually exceeding the endurance limits of the memory components.

FIG. 2 represents an operating scheme according to an embodiment of the present invention, in which periodic, intermittent elevated temperature cycles or thermal treatments are performed on NAND flash memory components of an SSD to increase the write endurance of the memory components. According to a preferred aspect of the invention, the thermal treatments are performed to facilitate the detrapping (release) of trapped electrons from at least one of and preferably both of the tunnel oxide layer and floating gate of each memory component. In this manner, a thermal treatment can be described as a self-healing step of a flash memory component. The operating scheme represented in FIG. 2 is particularly advantageous for use in an SSD in a high-traffic, high-access computer memory system environment, though such an environment is not a limitation to the invention.

In FIG. 2, the NAND flash memory components of the SSD are subjected to what can be a conventional operating mode, but are further subjected to an additional operating mode that includes the thermal treatment and can be inserted at various intervals into the operating scheme. The thermal treatment can be caused to occur at preselected intervals based on various criteria, including operating time and other operating parameters of the solid-state drive. Preferentially, thermal treatment occurs in off-peak traffic periods so that alternating pools of SSDs can be treated without resulting in loss of operation of a server farm. Another possible indication of a suitable thermal treatment interval can be load dependent and use subjecting the SSD to writes of some multiple of its capacity. Because current SSDs do not provide any indication of an impending failure, the thermal treatments proposed by the present invention can be viewed as a prophylactic approach to increasing the write endurance of the memory components.

To be effective, the preselected temperature of the thermal treatment is preferably at least 80° C., and more preferably in a range of about 85 to about 100° C., with preferred treatment temperatures being dependent on the particular NAND flash integrated circuits (ICs) on the SSD. Durations for such thermal treatments may be about five to fifteen minutes, though longer and shorter durations could be used. As previously noted, a heat-based self-healing of the tunnel oxide layer can have adverse effects on existing data or, in the case of multi-level cell (MLC) flash memory components, can induce a level shift that may alter the data, and therefore it is advantageous to perform the thermal treatments during offline periods, at the end of which the drive can be optionally subjected to a secure erase, that is, all memory components of the drive are completely erased. This scenario is of particular interest for data centers using solid-state drive arrays as first tier storage media that serve most of the memory traffic of a hierarchical storage management (HSM) but do not have extended requirements on data retention because the drives perform similar to a cache of a large capacity storage array in the background. As a result, a high data turnover rate is essentially a feature of a first tier storage media in a HSM system, and data retention beyond weeks or even days can be a negligible factor. At the same time, the high data turnover rate also causes excessive program/erase activity of the drives with very little time between program/erase cycles, thus exacerbating the effect of electron trapping and, by extension, greatly shortening the life span of the memory component and the solid-state drive as a whole. Therefore, it is believed that essentially any accelerated thermal treatment of the memory components will greatly aid in extending the write endurance and reducing failure and block retirement rates of memory components on the drive. In other words, periodic thermal treatment in accordance with FIG. 2 can be used to recondition the entire drive with respect to functionality and reliability.

Figure 3:
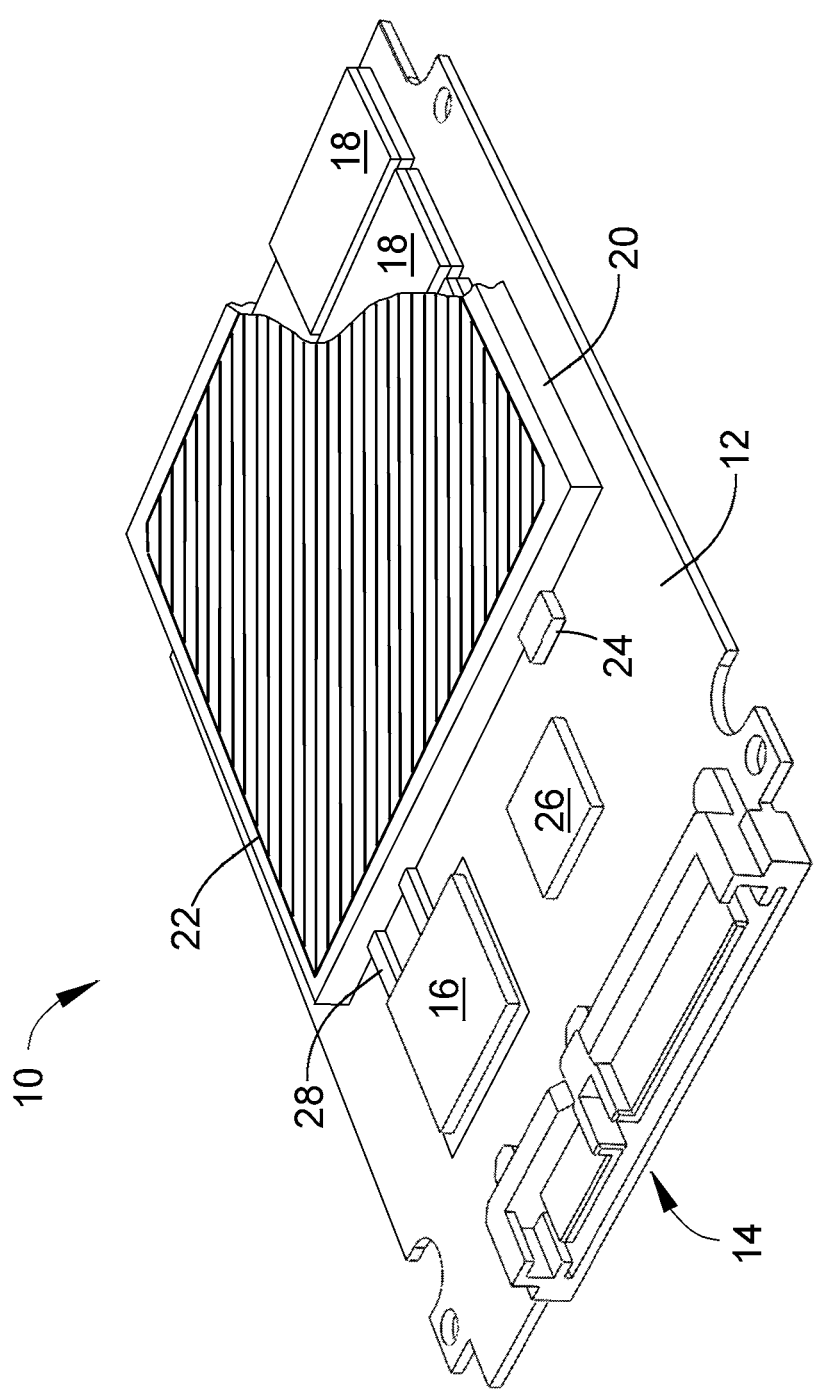
FIG. 3 represents a solid-state drive according to an embodiment of the invention, in which NAND flash solid-state memory components of the drive are enclosed within a compartment.

FIG. 3 schematically represents an SSD 10 adapted to implement an embodiment of the invention. The SSD 10 is shown as including a printed circuit board (PCB) 12 having a system interface connector 14. As understood in the art, the interface connector 14 is adapted to enable the SSD 10 to be accessed by a host system (not shown) equipped with a data and control bus for interfacing with the SSD 10. The bus may operate with any suitable protocol known in the art, preferred but nonlimiting examples being the advanced technology attachment (ATA) bus, particularly SATA, as well as the small computer system interface (SCSI) particularly the serially-attached SCSI (SAS) or fibre channel (FC). The SSD 10 further includes a memory controller 16 mounted on the PCB 12, for example, a SATA-flash controller, and an array of non-volatile memory components (chips) 18, in particular, solid-state memory components such as NAND flash memory components. The SSD 10 may further include cache and other circuit devices, including power converters (not shown). Suitable components for the controller 16, cache, and other circuit devices are well known in the art and therefore will not be described in any detail here.

As will be discussed below, the SSD 10 is particularly well suited for use in a server or enterprise environment, for example, as a tier and particularly first tier storage media of an HSM system that may utilize rotational media-based hard disk drives (HDD), optical discs, magnetic tape drives and/or other slower storage media as higher tiers of the HSM system. However, it should be understood that the SSD 10 could be employed in a personal computer, workstation or any other suitable type of processing apparatus in combination with a variety of memory storage media.

The area of the PCB 12 on which the flash memory components 18 are mounted is represented as being completely enclosed within a compartment 20, and therefore physically separated from the remaining area of the PCB 12 containing the controller 16 and other circuitry of the SSD 10. The compartment 20 is represented as a one-piece component whose lower edge is attached directly to the surface of the PCB 12 on which the memory components 18 are mounted, though other configurations for the compartment 20 are also within the scope of the invention. In addition, the compartment 20 is represented as comprising an on-board heating element in the form of a grid 22 adapted to regulate the temperature of the components 18 within the compartment 20. In particular, the grid 22 is adapted to heat the components 18 to the preselected temperature. According to the invention, the preselected temperature is above the intrinsic operating temperature of the components 18 on the PCB 12, in other words, above the temperature(s) of the components 18 that would otherwise inherently result from heat that is generated by the components on the PCB 12 and absorbed by the SSD 10 from its surrounding operating environment. As discussed in reference to FIG. 2, the preselected temperature is sufficient to serve as a thermal treatment of the memory components 18 and facilitate the release of electrons from the tunnel oxide layer and/or floating gate of each component 18 within the compartment 20. Though schematically represented as being a separate component attached to the exterior of the compartment 20, the grid 22 can be located within the interior of the compartment 20, for example, a separate component attached to an interior surface of the compartment 20 directly above the memory components 18. Furthermore, the grid 22 can be integrally formed as part of a wall of the compartment 20.

The heating grid 22 is preferably electrically powered, for example, one or more resistive heating elements that generate heat by Joule heating. Furthermore, the grid 22 preferably operates in combination with a thermo-element 24 of any suitable type capable of monitoring the temperature within the compartment 20 and providing feedback to appropriate control circuitry to maintain the temperature of the flash memory components 18 at the preselected temperature for a desired length of time. In FIG. 3, a separate control chip 26 is represented as being mounted on the PCB 12 for this purpose, though the control circuitry could be implemented elsewhere. As discussed above in reference to FIG. 2, the grid 22 may be controlled with the control chip 26 to perform a thermal treatment at a temperature of 80° C. or more, with a preferred range believed to be about 85 to about 100° C. It is also within the scope of the invention for the grid 22 to cycle the temperature of the flash memory components 18 between the preselected temperature and a lower temperature level. Based on changes in thermal expansion down to the atomic level, wherein a temperature change itself may constitute a more rigorous treatment than a simple increase in temperature, temperature cycling is generally believed to accelerate thermal effects beyond those achieved at a steady state temperature. The lower temperature level may be the result of a deliberate thermal input from the grid 22 to the compartment 20, such that the lower temperature level is above the intrinsic operating temperature of the components 18. Alternatively, the lower temperature level may correspond to the intrinsic operating temperature of the components 18 on the PCB 12, in other words, without any thermal input from the grid 22, such as was described above regarding the embodiment of FIG. 2. The heating grid 22 may also be operated to provide a preheating period, for example, in combination with a delayed power-up of the SSD 10, for example, under extreme cold operation conditions.

As discussed in reference to FIG. 2, overall reduced data retention may be a side effect of thermally treating the memory components 18. However, particularly when used as first tier storage media of an HSM system, the drawbacks of this reduced data retention may be negligible compared to the benefits of the thermal treatment, which include more rapid self-healing of the tunnel oxide layer and/or floating gate as well as the potential for a more constant and uniform temperature among the memory components 18 that may inhibit temperature change-induced level shifting which can alter the contents of data stored within multilevel cell flash memory.

The compartment 20 can be provided with or formed of a thermal insulating material to promote the thermal efficiency of the thermal treatment by inhibiting convection-induced and radiation-induced thermal dissipation from the memory components 18 to the host system, such as a server or other computing apparatus. In this, manner the additional power needed to heat the components 18 and to counteract heat losses to the environment (for example, an air-condition environment) is minimized. As an alternative or in addition to the grid 22, the memory components 18 could be heated by utilizing the compartment 20 as an additional heatsink/cooling element for other components on the PCB 12 and/or within the host system environment. For example, heat can be captured from the controller 16 with a heatsink and then transferred to the compartment 20 and its enclosed memory components 18, for example, through heatpipes 28. Still other means are foreseeable for heating the memory components 18. For example, whereas the heating methods discussed above primarily rely on conductive heat transfer, heat transfer through convection or radiation could also be employed.

While the present invention has been discussed mostly in the context of NAND flash memory components, other memory technologies are similarly suited to profit from a controlled thermal treatment of a type described above. For example, phase change memory (PCM) can, over time, suffer from scarring. Likewise, other memory technologies using heat-induced surface deformation as data storage can degrade over time by not returning to their native state. In mass storage devices using these solid-state memory technologies, the effect of a thermal treatment on their memory components as described above should be functionally equivalent to that described in exemplary fashion for the NAND flash memory components 18, in that it may also increase endurance of the media through thermal reconditioning of the data carrier.

Therefore, while the invention has been described in terms of specific embodiments, it is apparent that other forms could be adopted by one skilled in the art. For example, the physical configuration of the mass storage device (SSD 10) could differ from that shown, and functionally-equivalent components could be used or subsequently developed to perform the intended functions of components on the mass storage device, including the memory components 18 of the SSD 10. Therefore, the scope of the invention is to be limited only by the following claims.

The invention claimed is:

1. A mass storage device for use with a host system to store data, the mass storage device comprising:
   a printed circuit board;
   at least one solid-state memory component on the printed circuit board;
   a system interface connector on the printed circuit board and configured to connect the mass storage device to the host system;
   a memory controller on the printed circuit board and configured to communicate between the host system and the memory component;
   a compartment that encloses the memory component on the printed circuit board;
   means associated with the compartment for heating the memory component to a preselected temperature that is above an intrinsic operating temperature of the memory component and sufficient to thermally recondition the memory component and thereby increase the write endurance of the memory component; and
   means for controlling the heating means to heat the memory component to the preselected temperature;
   wherein the heating means is further configured to heat the memory component to a second temperature that is lower than the preselected temperature but above the intrinsic operating temperature of the memory component, and the controlling means is operable to cycle the compartment between the preselected and second temperatures.

2. The mass storage device of claim 1, wherein the compartment physically separates the memory component on the printed circuit board from the memory controller on the printed circuit board.

3. The mass storage device of claim 1, wherein the heating means directly contacts the compartment.

4. The mass storage device of claim 1, wherein the compartment inhibits convection and radiation heat transfer losses from the memory component to the host system.

5. The mass storage device of claim 1, further comprising means for monitoring the temperature within the compartment and providing feedback to the controlling means to maintain the memory component at the preselected temperature.

6. The mass storage device of claim 1, wherein the heating means comprises a Joule heating element.

7. The mass storage device of claim 1, wherein the heating means and the controlling means are configured to periodically heat the memory component.

8. The mass storage device of claim 1, wherein the heating means operates to continuously heat the memory component.

9. The mass storage device of claim 1, wherein the memory component is a NAND flash solid-state memory component having a tunnel oxide layer and a floating gate, and the preselected temperature is sufficient to release electrons from at least one of the tunnel oxide layer and the floating gate of the memory component.

10. The mass storage device of claim 1, wherein the host system is a hierarchical storage management system and the mass storage device is first tier storage media thereof.

11. A method for increasing write endurance of at least one solid-state memory component of a mass storage device connected to a host system for storing data thereof, the method comprising:
   heating the memory component above an intrinsic operating temperature of the memory component and to a preselected temperature that is sufficient to thermally recondition the memory component and thereby increase the write endurance of the memory component;
   inhibiting convection and radiation heat transfer losses from the memory component to the host system; and
   cycling the memory component between the preselected temperature and a lower second temperature that is above the intrinsic operating temperature of the memory component.

\* \* \* \* \*